US010382067B2

(12) United States Patent
Sharon et al.

(10) Patent No.: US 10,382,067 B2
(45) Date of Patent: Aug. 13, 2019

(54) PARAMETERIZED ITERATIVE MESSAGE PASSING DECODER

(71) Applicant: Western Digital Technologies, Inc., San Jose, CA (US)

(72) Inventors: Eran Sharon, Rishon Lezion (IL); Ariel Navon, Revava (IL); Omer Fainzilber, Even Yehuda (IL); Stella Achtenberg, Netanya (IL); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 155 days.

(21) Appl. No.: 15/617,629

(22) Filed: Jun. 8, 2017

(65) Prior Publication Data

US 2018/0358988 A1    Dec. 13, 2018

(51) Int. Cl.
    *H03M 13/00*      (2006.01)
    *H03M 13/37*      (2006.01)
    *H03M 13/25*      (2006.01)
    *H03M 13/29*      (2006.01)
    *H03M 13/11*      (2006.01)
    *G06F 11/10*      (2006.01)
    *G11B 20/18*      (2006.01)

(52) U.S. Cl.
    CPC ..... *H03M 13/3723* (2013.01); *G06F 11/1012* (2013.01); *H03M 13/1111* (2013.01); *H03M 13/255* (2013.01); *H03M 13/2948* (2013.01); *H03M 13/3715* (2013.01); *G06F 11/1076* (2013.01); *G11B 2020/185* (2013.01)

(58) Field of Classification Search
    CPC ........... H03M 13/255; H03M 13/2948; H03M 13/1125; H03M 13/616; H03M 7/4068; H03M 13/1111; H03M 13/1114; H03M 13/3927; H03M 13/3905; G06F 11/1076; G11B 2020/185
    USPC .................. 714/755, 780, 800–805
    See application file for complete search history.

(56) References Cited

U.S. PATENT DOCUMENTS

| | | | |
|---|---|---|---|
| 7,783,958 B1 * | 8/2010 | Eidson ................. | H03G 3/3078 455/452.1 |
| 7,814,401 B2 | 10/2010 | Alrod et al. | |
| 7,966,546 B2 * | 6/2011 | Mokhlesi ............ | G06F 11/1068 714/773 |
| 7,975,209 B2 * | 7/2011 | Chin ................... | G06F 12/0246 375/262 |

(Continued)

*Primary Examiner* — Albert Decady
*Assistant Examiner* — Osman M Alshack
(74) *Attorney, Agent, or Firm* — Vierra Magen Marcus LLP

(57) ABSTRACT

Technology is described herein for learning parameters for a parameterized iterative message passing decoder, and to a corresponding parameterized iterative message passing decoder. Learning the parameters may adapt the decoder to statistical dependencies introduced by the specific code's graph. Taking into account the statistical dependencies may allow the code to be shorter and/or denser. Note that the statistical dependencies in the graph may be extremely complex. Machine learning may be used to learn the parameters. The parameters may be learned when decoding data stored in the memory device. Learning the parameters may adapt the decoder to properties of data stored in the memory device, physical properties of the memory device, and/or patterns in host data.

19 Claims, 12 Drawing Sheets

(56) References Cited

U.S. PATENT DOCUMENTS

| | | | |
|---|---|---|---|
| 8,504,895 B2 | 8/2013 | Sharon et al. | |
| 8,856,615 B1* | 10/2014 | Krishnan | H03M 13/2957 |
| | | | 714/718 |
| 9,280,421 B2 | 3/2016 | Nazarian et al. | |
| 9,490,035 B2* | 11/2016 | Tsai | G11C 29/808 |
| 9,569,120 B2 | 2/2017 | Ryan et al. | |
| 2005/0204271 A1* | 9/2005 | Sharon | H03M 13/1117 |
| | | | 714/801 |
| 2008/0244338 A1* | 10/2008 | Mokhlesi | G06F 11/1068 |
| | | | 714/702 |
| 2008/0244368 A1* | 10/2008 | Chin | G06F 11/1072 |
| | | | 714/800 |
| 2010/0088575 A1* | 4/2010 | Sharon | G06F 11/1072 |
| | | | 714/763 |
| 2010/0153821 A1* | 6/2010 | Keeler | G06F 11/1068 |
| | | | 714/773 |
| 2010/0192043 A1* | 7/2010 | Alrod | H03M 13/1111 |
| | | | 714/763 |
| 2016/0332079 A1* | 11/2016 | Mugan | A63F 13/57 |

* cited by examiner $$\frac{dI}{dQ_v^j} = \frac{b_v \cdot e^{-b_v \cdot Q_v^j}}{\ln(2) \cdot \left(1 + e^{-b_v \cdot Q_v^j}\right)}$$

Fig. 8A $$\frac{dQ_v^j}{dR_{c'v}^j} = \alpha_{c'v}^j$$

Fig. 8B $$\frac{dQ_v^j}{d\alpha_{c'v}^j} = R_{c'v}^j$$

Fig. 8C $$\frac{dR_{cv}^j}{dQ_{v'c}^{j-1}} = \frac{\beta_{v''c,v}^{j-1} \cdot \prod_{v'' \in N(c) \setminus v} \left(\tanh\left(Q_{v'',c}^{j-1}/2\right)\right)^{\beta_{v''c,v}^{j-1}} \cdot \left(1 - \left(\tanh\left(Q_{v',c}^{j-1}/2\right)\right)^2\right)}{\left(1 - \left(\prod_{v'' \in N(c) \setminus v} \left(\tanh\left(Q_{v'',c}^{j-1}/2\right)\right)^{\beta_{v''c,v}^{j-1}}\right)^2\right) \cdot \tanh\left(Q_{v',c}^{j-1}/2\right)}$$

Fig. 8D $$\frac{dR_{cv}^j}{d\beta_{v'c,v}^{j-1}} = \frac{\prod_{v'' \in N(c) \setminus v} \left(\tanh\left(Q_{v'',c}^{j-1}/2\right)\right)^{\beta_{v''c,v}^{j-1}} \cdot \ln\left(\tanh\left(Q_{v',c}^{j-1}/2\right)\right)}{1 - \left(\prod_{v'' \in N(c) \setminus v} \left(\tanh\left(Q_{v'',c}^{j-1}/2\right)\right)^{\beta_{v''c,v}^{j-1}}\right)^2}$$

Fig. 8E $$\frac{dQ_{vc}^j}{dR_{c'v}^j} = \alpha_{c'v,c}^j \qquad \frac{dQ_{vc}^j}{d\alpha_{c'v,c}^j} = R_{c'v}^j$$

Fig. 8F  Fig. 8G $$\frac{dI}{d\alpha_{c'v,c}^j} = \frac{dQ_{vc}^j}{d\alpha_{c'v,c}^j} \cdot \frac{dR_{cv'}^{j+1}}{dQ_{vc}^j} \cdot \frac{dQ_{v'c''}^{j+1}}{dR_{cv'}^{j+1}} \cdot \ldots \cdot \frac{dQ_{v'''}^{j+l}}{dR_{c'''v'''}^{j+l}} \cdot \frac{dI}{dQ_{v'''}^{j+l}}$$

Fig. 8H $$\frac{dI}{d\beta_{v'c,v}^j} = \frac{dR_{cv}^{j+1}}{d\beta_{v'c,v}^j} \cdot \frac{dQ_{vc'}^{j+1}}{dR_{cv}^{j+1}} \cdot \frac{dR_{c'v''}^{j+2}}{dQ_{vc'}^{j+1}} \cdot \ldots \cdot \frac{dQ_{v'''}^{j+l}}{dR_{c'''v'''}^{j+l}} \cdot \frac{dI}{dQ_{v'''}^{j+l}}$$

Fig. 8I $$\frac{dI}{d\alpha_{c'v}^j} = \frac{dQ_v^j}{d\alpha_{c'v}^j} \cdot \frac{dI}{dQ_v^j}$$

Fig. 8J $$\frac{Q_{vc}}{dR_{c'v}} = \alpha_{c'v,c,1} \cdot e^{-\alpha_{c'v,c,2}|R_{c'v}|} + \alpha_{c'v,c,3} \cdot \left(1 - e^{-\alpha_{c'v,c,4}|R_{c'v}|}\right) +$$

$$\left(\alpha_{c'v,c,3} \cdot \alpha_{c'v,c,4} \cdot e^{-\alpha_{c'v,c,4}|R_{c'v}|} - \alpha_{c'v,c,1} \cdot \alpha_{c'v,c,2} \cdot e^{-\alpha_{c'v,c,2}|R_{c'v}|}\right) \cdot R_{c'v}$$

Fig. 8K $$\frac{Q_{vc}}{d\alpha_{c'v,c,1}} = e^{-\alpha_{c'v,c,2}|R_{c'v}|} \cdot R_{c'v}$$

Fig. 8L $$\frac{Q_{vc}}{d\alpha_{c'v,c,3}} = \left(1 - e^{-\alpha_{c'v,c,4}|R_{c'v}|}\right) \cdot R_{c'v}$$

Fig. 8M $$\frac{Q_{vc}}{d\alpha_{c'v,c,4}} = \alpha_{c'v,c,3} \cdot e^{-\alpha_{c'v,c,4}|R_{c'v}|} \cdot |R_{c'v}| \cdot R_{c'v}$$

PARAMETERIZED ITERATIVE MESSAGE PASSING DECODER

BACKGROUND

The present technology relates to learning parameters for a parameterized iterative message passing decoder.

Iterative error correction coding schemes have become very popular in recent years. A popular class of iterative codes is low-density parity-check (LDPC) codes. If properly designed, iterative error correction coding can approach the Shannon limit as the code length increases. However, a large code length may incur both a latency penalty and a complexity penalty. Hence, in some applications using short codes is beneficial. For example, short codes may be beneficial for error correction codes for storage class memory. Unfortunately, iterative coding schemes perform poorly for short codes, exhibiting degraded performance compared to maximum a posteriori (MAP) decoding, as the code becomes shorter and denser.

BRIEF DESCRIPTION OF THE DRAWINGS

FIGS. 8A-8G are examples of partial derivatives that may be computed during the backward pass of one embodiment of step 706 of process 700 in FIG. 7.

FIGS. 8H-8J are examples of parameter gradients that may be computed during the backward pass of one embodiment of step 706 of process 700 in FIG. 7.

FIGS. 8K-8N depict example derivative expressions for the backward pass for the variable to check message rule of Equation 16.

DETAILED DESCRIPTION

Figure 1:
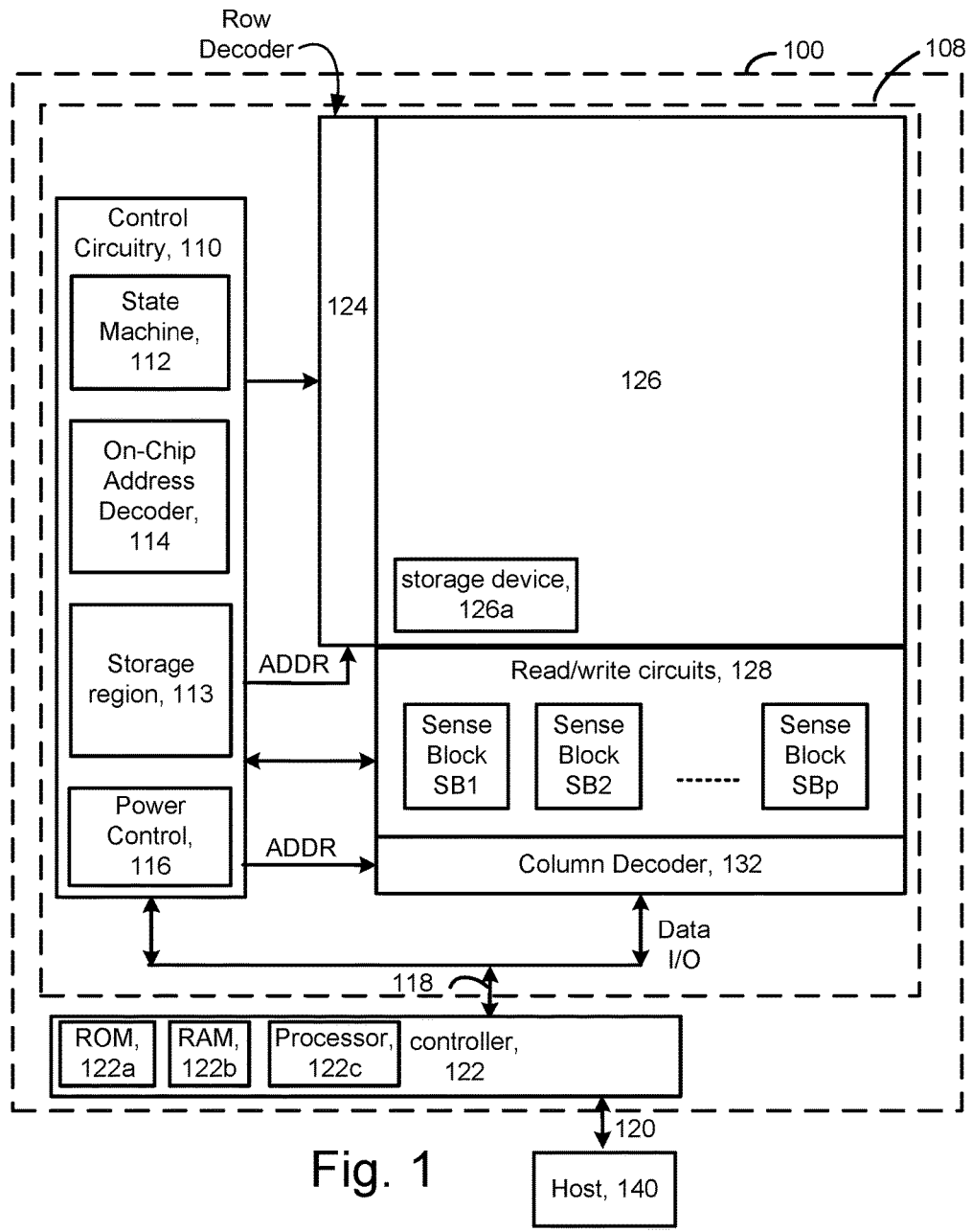
FIG. 1 is a functional block diagram of a memory device in which embodiments may be practiced.

The present technology pertains to learning parameters for an iterative message passing decoder, and to a corresponding parameterized iterative message passing decoder.

Iterative coding schemes may perform poorly for short codes. A reason for this is that computations performed by some conventional iterative message passing decoders assume statistical independence of the messages. This assumption may be asymptotically justified, but becomes less and less accurate when the code is shorter and/or denser. In other words, the assumption may be justified if the code is long enough. The computations for some conventional message passing decoders do not take into account the statistical dependencies between messages exchanged during the decoding process. Such statistical dependencies may be caused by cycles in the code's underlying graph. For example, a sparse bipartite graph upon which the decoder is based may have cycles, which introduce statistical dependencies between messages.

One embodiment includes a parameterized iterative message passing decoder. One embodiment includes learning parameters for a parameterized iterative message passing decoder. The parameters may be in message passing computation rules used by the parameterized iterative message passing decoder.

Learning parameters may adapt the parameterized iterative message passing decoder to statistical dependencies introduced by the specific code's graph. Taking into account the statistical dependencies may allow the code to be shorter and/or denser. Note that the statistical dependencies in the graph may be extremely complex. In one embodiment, machine learning is used to learn the complex statistical dependencies. In one embodiment, machine learning is used to train the decoder on a specific graph.

Learning parameters may adapt the parameterized iterative message passing decoder to properties of data stored in a memory device. Learning such properties may improve read throughput. For example, some data may be written once and read back many times. This is sometimes referred to as "cold data." Examples of such cold data are operational system boot sequences and at least some social media content. With such cold data there may be "noise realizations", which repeat with each reading. For example, a certain memory cell might have been programmed to either the wrong data state or to a grey area between data states. By revising the parameters in the parameterized iterative message passing decoder, the decoder can learn about such properties. Therefore, the decoder can converge faster to save time reading the cold data. This can also save power. Also, the decoder may have fewer instances of failing to converge.

Learning parameters may adapt the parameterized iterative message passing decoder to physical properties of the memory device. There may be variance of physical properties between memory devices, as well as different regions therein. Also, the physical properties may change over time due to, for example, physical degradation. Conventionally, an iterative message passing decoder may be designed to provide a good result for typical physical properties of the memory device. By learning physical properties of the memory device, an embodiment of a parameterized iterative message passing decoder performs better (e.g., converges faster, saves power, etc.).

Learning parameters may help to train the parameterized iterative message passing decoder to perform better for the characteristics of host data to be stored in the memory device. For example, the host data may have certain patterns, such as the ratio of ones to zeros. In one embodiment, by tailoring the parameters to the host data patterns, the parameterized iterative message passing decoder performs better (e.g., converges faster, saves power, etc.).

Technology described herein may be used with a variety of types of memory systems. However, it will be appreciated that technology described herein is not limited to memory systems. FIG. 1 is a functional block diagram of a memory device in which embodiments may be practiced. The memory system 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory system 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD select gates and source lines. The sense blocks can include bit line drivers, in one approach. An SGS select is a gate transistor at a source-end of a NAND string, and an SGD select gate is a transistor at a drain-end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide functionality described herein. Alternatively or additionally, the processor can access code from a storage device 126a of the memory structure, such as a reserved area of memory cells in one or more word lines.

The code is used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports. In some embodiments, the controller 122 encodes floating point numbers into binary strings. The controller 122 along with control circuitry 110, and read/write circuits 128 may store the binary strings in the memory array 126.

Other types of non-volatile memory in addition to NAND flash memory can also be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels.

One of skill in the art will recognize that this technology is not limited to the two dimensional and three dimensional exemplary structures described but covers all relevant memory structures within the spirit and scope of the technology as described herein and as understood by one of skill in the art.

Figure 2:
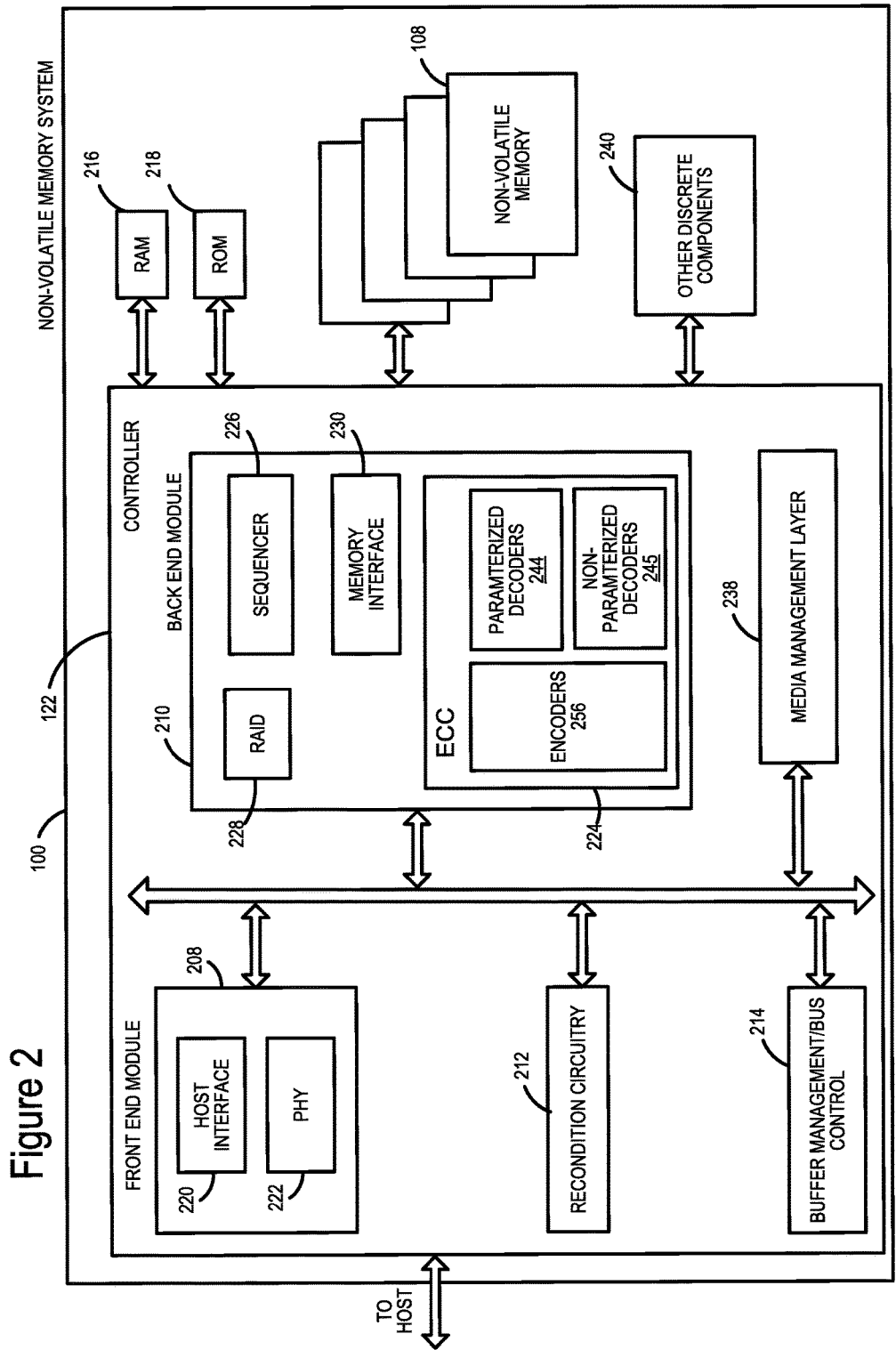
FIG. 2 is a block diagram of example memory system, depicting more details of one embodiment of the controller of FIG. 1.

FIG. 2 is a block diagram of example memory system 100, depicting more details of Controller 122. In one embodiment, the system of FIG. 2 is a solid state drive. As used herein, a memory Controller is a device that manages data stored on memory and communicates with a host, such as a computer or electronic device. A memory Controller can have various functionality in addition to the specific functionality described herein. For example, the memory Controller can format flash memory to ensure the memory is operating properly, map out bad memory cells, and allocate spare memory cells to be substituted for future failed cells. Some part of the spare cells can be used to hold firmware to operate the flash memory Controller and implement other features. In operation, when a host needs to read data from or write data to the memory, it will communicate with the memory Controller. If the host provides a logical address (LA) to which data is to be read/written, the memory Controller can convert the logical address received from the host to a physical address in the memory. (Alternatively, the host can provide the physical address). The memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable interface. In one embodiment, memory system 100 may be a card based system, such as a secure digital (SD) or a micro secure digital (micro-SD) card. In an alternative embodiment, memory system 100 may be part of an embedded memory system. For example, the memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 2, Controller 122 includes a front end module 208 that interfaces with a host, a back end module 210 that interfaces with the one or more non-volatile memory die 108, and various other modules that perform functions which will now be described in detail.

The components of Controller 122 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for Controller 122 to perform the functions described herein. The architecture depicted in FIG. 2B is one example implementation that may (or may not) use the components of Controller 122 depicted in FIG. 2 (i.e., RAM, ROM, processor).

Controller 122 may include recondition circuitry 212, which is used for reconditioning memory cells or blocks of memory. Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 2 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. The ECC engine 224 has a parameterized decoder 244, a non-parameterized decoder 245, and one or more encoders 256. In one embodiment, the decoders 244, 245 are low-density parity check (LDPC) decoders. An output of the one or more decoders 244, 245 may be provided to the host.

Some embodiments of decoders 244, 245 are based on a sparse bipartite graph having bit (or variable) nodes and check nodes. The decoders 244, 245 may pass messages between the bit nodes and the check nodes. Passing a message between a bit node and a check node is accomplished by performing a message passing computation, in some embodiments. The message passing computation may be based on believe propagation. In some embodiments, the memory system 100 learns parameters for the message passing computations for the parameterized decoder 244. Learning the parameters may be used to adapt the decoder 244 to statistical dependencies between the message passing computations, but is not limited thereto. Learning the parameters may be used to adapt the decoder 244 to properties of cold data stored in the memory array. Learning the parameters may be used to adapt the decoder 244 to noise realizations. Learning the parameters may be used to adapt the decoder 244 to noise statistics (or noise characteristics). Learning the parameters may be used to adapt the decoder 244 to characteristics of host traffic.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Media Management Layer (MML) 238 may be integrated as part of the management that may handle errors and interfacing with the host. In one embodiment, MML 238 is a flash translation layer. In particular, MML may be responsible for the internals of NAND management. In particular, the MML 238 may include an algorithm in the memory device firmware which translates writes from the host into writes to the memory of die 108. The MML 238 may be needed because: 1) the memory may have limited endurance; 2) the memory may only be written in multiples of pages; and/or 3) the memory may not be written unless it is erased as a block. The MML 238 understands these potential limitations of the memory which may not be visible to the host. Accordingly, the MML 238 attempts to translate the writes from host into writes into the memory.

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 3:
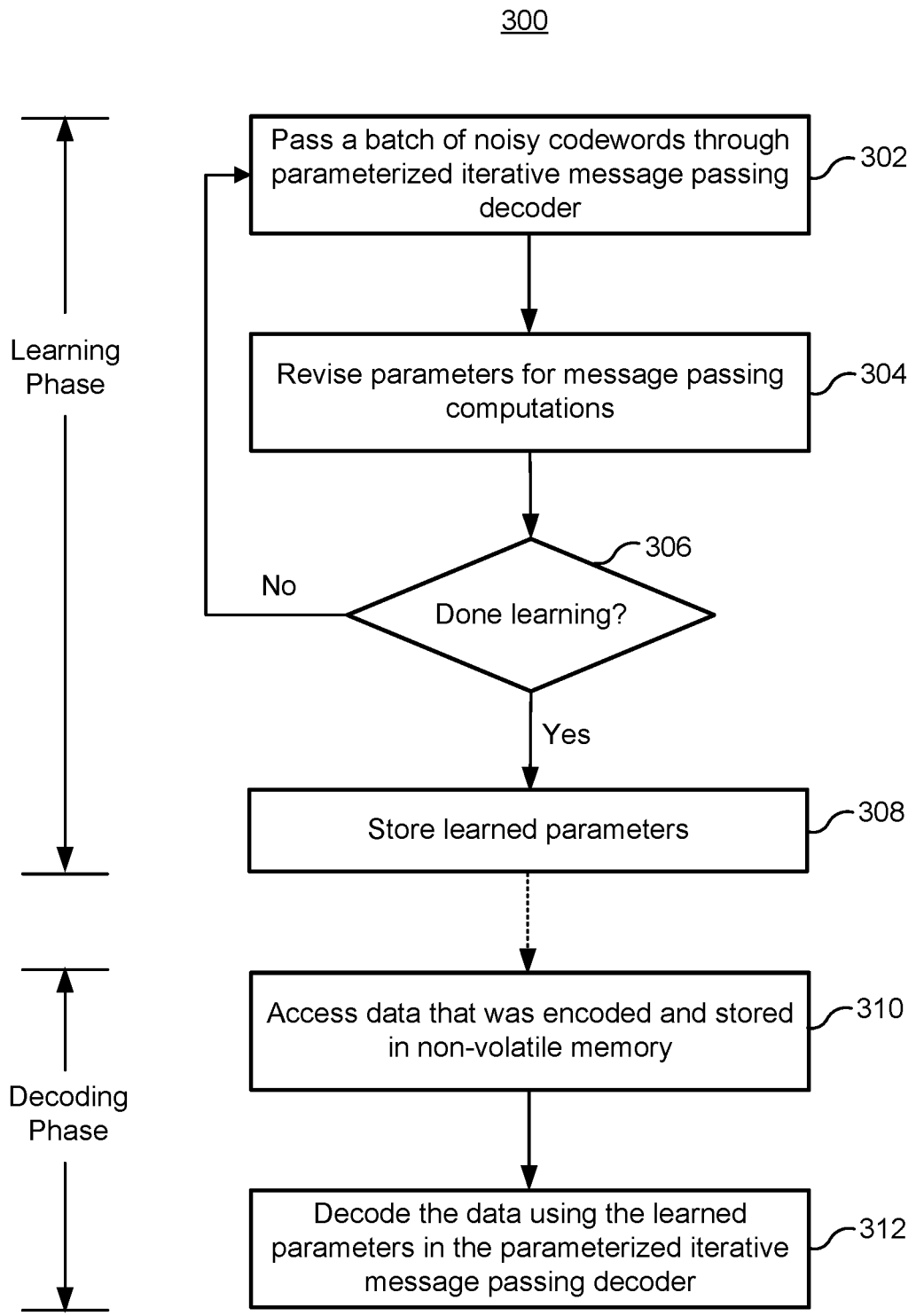
FIG. 3 is a flowchart of one embodiment of a process of learning and using parameters in a parameterized iterative message passing decoder.

FIG. 3 is a flowchart of one embodiment of a process 300 of learning and using parameters in a parameterized iterative message passing decoder 244. The process 300 is divided between a learning phase and a decoding phase. The learning phase uses machine learning, in one embodiment, to learn parameters for message passing computations. The message passing computations are based on belief propagation rules, in one embodiment. However, process 300 is not limited to belief propagation rules. The message passing computations are min-sum computation rules, in one embodiment. The decoding phase uses the learned parameters to decode data. As will be discussed below, process 300 may involve clean versions of codewords and noisy versions of those codewords.

In one embodiment, the learning phase is performed offline. By offline it is meant that the learning occurs prior to the memory system 100 being used to store user data. In this case, the training data may be noisy versions of arbitrarily generated codewords. Note that it is feasible to generate an enormous number of noisy versions of arbitrarily generated codewords. Hence, it is feasible to generate a large set of training data. In one embodiment, the learning phase is performed online. By online it is meant that the learning occurs when the memory system 100 is being used to store user data. In this case, the training data may be actual data read from the memory array 126. The decoding phase is typically performed online. That is, the decoding phase is typically performed on data stored in the memory array 126.

Step 302 is to pass a batch of noisy codewords through a parameterized iterative message passing decoder 244. In one embodiment, the noisy codewords are represented as a vector of a-priori log-likelihood ratios. In an offline embodiment, the noisy codewords may be generated by adding arbitrary noise to clean versions of the codewords. In an online embodiment, the noisy codewords may be generated by forming a-priori LLRs based on data read from memory cells that were programmed with clean versions of the codewords. The a-priori LLRs may be based on reading only hard bits, reading both hard bits and soft bits, etc.

Figure 7:
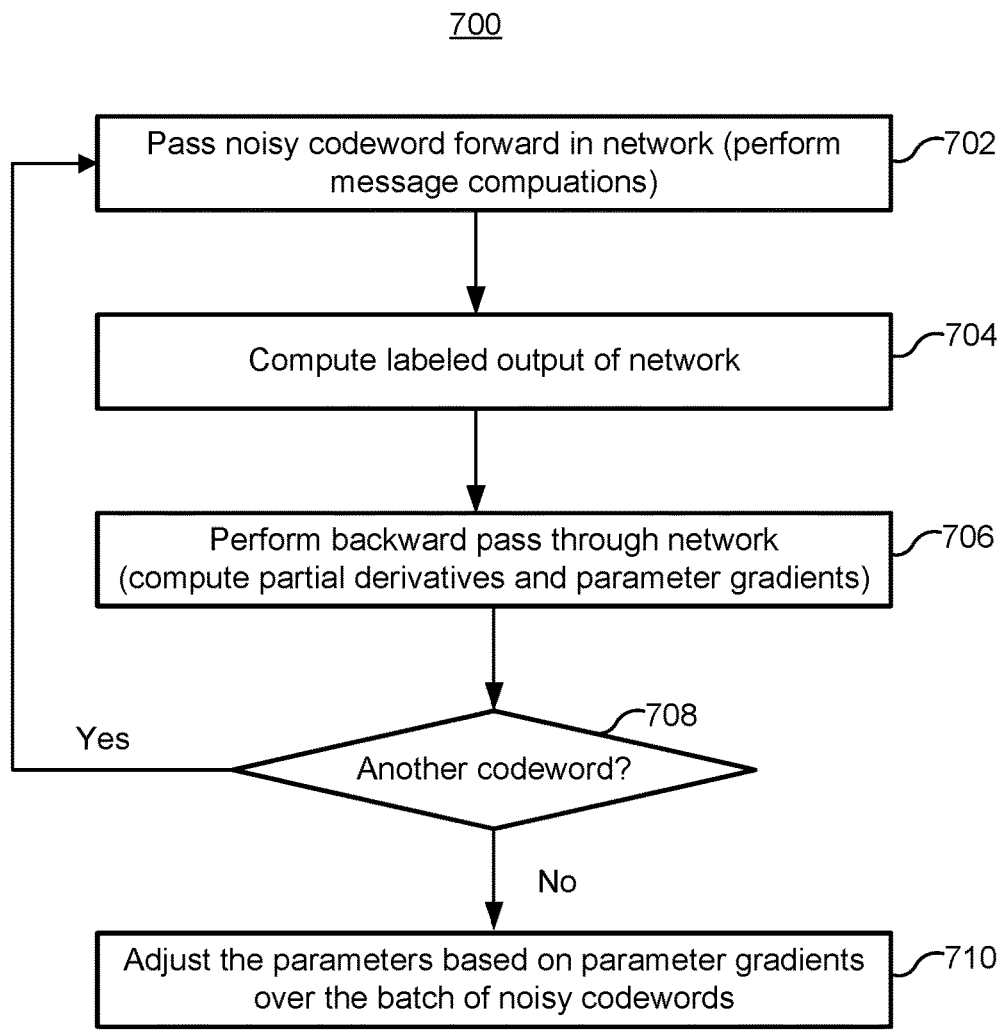
FIG. 7 is a flowchart of one embodiment of a process 700 of learning parameters for message passing computations.

The number of noisy codewords in the batch can vary. Note that step 302 may include passing one codeword through the decoder 244 at a time. Process 700 in FIG. 7 provides further details for one embodiment of passing individual noisy codewords in one batch through a decoder 244.

The parameterized iterative message passing decoder 244 performs message passing computations, in one embodiment. In one embodiment, the message passing computations are based on belief propagation rules. At least some of the message passing computations have one or more parameters to be learned, in one embodiment. Step 302 results in a decoder 244 result. In one embodiment, the decoder 244 result is a set of a-posteriori LLRs. The a-posteriori LLRs include an estimate for each bit in the codeword and a reliability of that estimate, in one embodiment.

Step 304 is to revise parameters for message passing computations of the parameterized iterative message passing decoder 244. The parameters are revised based on what was learned from the entire batch of codewords, in one embodiment. In one embodiment, the parameters are revised based on a labeled output of the decoder 244. The term "labeled output" is used herein as this term is commonly used in machine learning. The labeled output may be based on mutual information between the decoder result (e.g., a-posteriori LLRs) and the clean codewords. Further details are discussed below.

Each time the process 300 performs steps 302 and 304, the parameters may be further revised. Step 306 is a determination of whether the parameters have been adequately learned. In one embodiment, step 306 includes determining whether a labeled output has saturated. In one embodiment, step 306 includes determining whether a certain number of batches of noisy codewords have been processed.

Step 308 is to store the learned parameters. In one embodiment, the learned parameters are stored in the memory array 126. In one embodiment, the learned parameters are stored in the ROM 122a. In one embodiment, the learned parameters are stored in the storage region 113.

The arrow between step 308 and 310 is dashed to indicate that considerable time may pass between these two steps. Step 310 includes accessing data that was encoded and stored in non-volatile memory. That is, the data was encoded in accordance with the code used by the decoder 244.

Step 312 includes decoding the data using the learned parameters in the parameterized iterative message passing decoder 244.

Figures 4, 5:
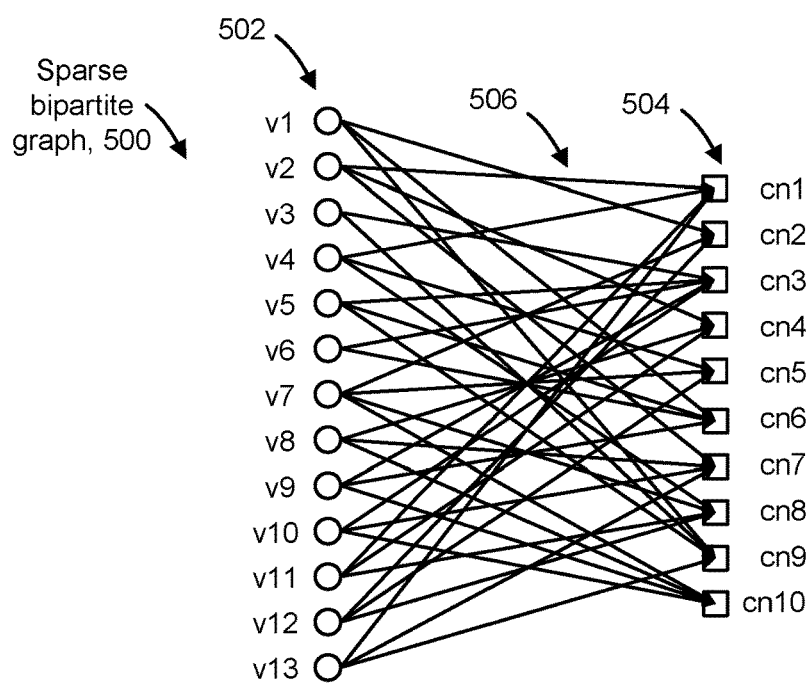
FIG. 4 depicts an example of a sparse parity check matrix H.
FIG. 5 depicts a sparse bipartite graph which corresponds to the sparse parity check matrix of FIG. 4.

In some embodiments, the parameterized iterative message passing decoder 244 is based on a sparse parity check matrix (which can also be represented as a sparse bipartite graph). FIG. 4 depicts an example of a sparse parity check matrix H. The matrix includes M rows and K+M columns, which are in correspondence with K information bits and M parity bits in each codeword of length N=K+M. Further, the parity bits are defined such that M parity check equations are satisfied, where each row of the matrix represents a parity check equation.

FIG. 5 depicts a sparse bipartite graph 500 which corresponds to the sparse parity check matrix of FIG. 4. Specifically, the code can be defined by a sparse bipartite graph G=(V,C,E) with a set V of N bit nodes 502 (N=13 in this example), a set C of M check nodes 504 (M=10 in this example) and a set E (E=38 in this example) of edges 506 connecting bit nodes 502 to check nodes 504. The bit nodes correspond to the codeword bits and the check nodes correspond to parity-check constraints on the bits. A bit node 502 is connected by edges 506 to the check nodes 504 it participates in.

During decoding, one embodiment of the parameterized iterative message decoder 244 attempts to satisfy the parity checks. In this example, there are ten parity checks, as indicated by the check nodes cn1 through cn10. The first parity check at cn1 determines if $v2 \oplus v4 \oplus v11 \oplus v13=0$, where "s" denotes the exclusive-or (XOR) logical operation. This check is satisfied if there is an even number of "1" in bits corresponding to variable nodes v2, v4, v11 and v13. This check is denoted by the fact that arrows from variable nodes v2, v4, v11 and v13 are connected to check node cn1 in the bi-partite graph. The second parity check at cn2 determines if $v1 \oplus v7 \oplus v12=0$, the third parity check at cn3 determines if $v3 \oplus v5 \oplus v6 \oplus v9 \oplus v10=0$, the fourth parity check at cn4 determines if $v2 \oplus v8 \oplus v11=0$, the fifth parity check at cn5 determines if $v4 \oplus v7 \oplus v12=0$, the sixth parity check at cn6 determines if $v1 \oplus v5 \oplus v6 \oplus v9=0$, the seventh parity check at cn7 determines if $v2 \oplus v8 \oplus v10 \oplus v13=0$, the eighth parity check at cn8 determines if $v4 \oplus v7 \oplus v11 \oplus v12=0$, the ninth parity check at cn9 determines if $v1 \oplus v3 \oplus v5 \oplus v13=0$ and the tenth parity check at cn10 determines if $v7 \oplus v8 \oplus v9 \oplus v10=0$.

In one embodiment, the parameterized iterative message decoder 244 uses an iterative probabilistic decoding process involving iterative message passing decoding algorithms. These algorithms operate by exchanging messages between bit and check nodes over the edges of the underlying bipartite graph representing the code.

The parameterized iterative message decoder 244 may be provided with initial estimates of the codeword bits (based on the communication channel output or based on the read content from the memory array). These initial estimates may be refined and improved by imposing the parity-check constraints that the bits should satisfy as a valid codeword. This may be done by exchanging information between the bit nodes representing the codeword bits and the check nodes representing parity-check constraints on the codeword bits, using the messages that are passed along the graph edges.

For example, the iterating can involve serially traversing the check nodes and updating the LLR values of the bits involved based on each parity check. In one approach, an attempt is made to satisfy the first parity check of cn1. Once that parity check is satisfied, an attempt is made to satisfy the cn2 parity check and so forth. The LLR values are adjusted, if necessary, in each iteration, in a manner known to those skilled in the art.

Specifically, in iterative decoding algorithms, it is common to utilize "soft" bit estimations, which convey both the bit estimation and the reliability of the estimation.

The bit estimations conveyed by the messages passed along the graph edges can be expressed in various forms. A common measure for expressing "soft" bit estimation is the Log-Likelihood Ratio (LLRs), defined as follows:

$$LLR = \log \frac{Pr(v=0 \mid \text{current constraints and observations})}{Pr(v=1 \mid \text{current constraints and observations})} \quad (1)$$

where the "current constraints and observations" are the various parity-check constraints taken into account in computing the message at hand and the observations corresponding to the bits participating in these parity checks. Without loss of generality, we assume that LLR messages are used throughout the rest of this document. The sign of the LLR typically provides the bit estimation (i.e. positive LLR corresponds to v=0 and negative LLR corresponds to v=1). The magnitude of the LLR provides the reliability of the estimation (i.e. |LLR|=0 means that the estimation is completely unreliable and |LLR|=∞ means that the estimation is completely reliable and the bit value is known).

Usually, the messages passed during the decoding along the graph edges between bit nodes and check nodes are extrinsic. An extrinsic message 'm' passed from a bit node 'v' on edge 'e' may take into account all the values received on edges connected to bit node 'v' other than edge 'e' (this is why it is called extrinsic—since it is based only on new information).

An example of a message passing decoding algorithm is a Belief-Propagation (BP) algorithm. Let $$P_v = \log \frac{Pr(v=0 \mid y)}{Pr(v=1 \mid y)} \quad (2)$$

denote the initial decoder estimation for bit v, based only on the received or read symbol 'y'. Note that it is also possible that some of the bits are not transmitted through the communication channel or stored in the memory array, hence there is no 'y' observation for these bits. In this case, there are two possibilities: 1) shortened code, e.g., the bits are known a priori and $P_v = \pm \infty$ (depending on whether the bit is 0 or 1), and 2) punctured bits—the bits are unknown a priori and $$P_v = \log \frac{Pr(v=0)}{Pr(v=1)} \quad (3)$$

where Pr(v=0) and Pr(v=1) are the a priori probabilities that the bit v is 0 or 1 respectively. In the contents of flash memory, punctured bits are simply not stored in the memory array. Assuming the information bits have equal a priori probabilities to be 0 or 1 and assuming the code is linear, then:

$$P_v = \log \frac{1/2}{1/2} = 0 \quad (4)$$

Let $$Q_v = \log \frac{Pr(v=0 \mid \underline{y}, H \cdot \underline{v}=0)}{Pr(v=1 \mid \underline{y}, H \cdot \underline{v}=0)} \quad (5)$$

denote the final decoder estimation for bit 'v', based on the entire received or read sequence 'y' and assuming that bit 'v' is part of a codeword (i.e. assuming H·$\underline{v}$=0).

Let $Q_{vc}$ and $R_{cv}$ denote a message from bit node 'v' to check node 'c' and a message from check node 'c' to bit node 'v', respectively. A conventional BP algorithm utilizes the following update rules for computing the messages. A conventional bit node to check node computation rule is:

$$Q_{vc}^j = P_v + \sum_{c' \in N(v) \backslash c} R_{c'v}^j \quad (6)$$

Here N(v) denotes the set of neighbors of a node 'v' in the graph G and N(v)\c refers to the neighbors excluding node 'c'. Here, "j" refers to the iteration. A check node to bit node computation rule in a conventional BP algorithm is:

$$R_{cv}^{j+1} = 2 \cdot \tanh^{-1} \left( \prod_{v' \in N(c) \backslash v} \tanh\left(\frac{Q_{v'c}^j}{2}\right) \right) \quad (7)$$

In a similar manner, N(c), denotes the set of bit node neighbors of a check node 'c' in the graph G and N(c)\v refers to the neighbors excluding node 'v'. A conventional final decoder estimation for bit 'v' is:

$$Q_v^j = P_v + \sum_{c' \in N(v)} R_{c'v}^j \quad (8)$$

Referring back to FIG. 3, parameters are learned for message passing computations. One example is to learn one or more parameters for a bit node to check node computation, such as the example in Equation 6. Another example is to learn one or more parameters for a check node to bit node computation, such as the example in Equation 7. Another example is to learn one or more parameters for a final decoder estimation for bit 'v', such as the example in Equation 8. In one embodiment, one or more parameters are leaned for each edge in a graph that represents the code. However, it is not necessary to learn a parameter for each edge in the graph.

Equation 9 is one embodiment of a parameterized message passing computation having a parameter $\alpha_{c,v,c'}^{j}$. Note that this is a variation of the example in Equation 6. The "j" indicates the iteration. Note that alpha depends on the bit node (v) and check node (c). In one embodiment, the alpha parameter (for a given bit node and check node) may be different for each iteration. However, the alpha parameter (for a given bit node and check node) could be the same for each iteration to simply the learning process and number of saved parameters. Also, note that Equation 9 pertains to messages for different edges in the graph (as given by "c" and "v"). However, as will be noted below, it is possible to reduce the number of alpha parameters that need to be learned. Hence, it is not required to learn a separate alpha parameter for each edge represented in Equation 9.

$$Q_{vc}^{j} = P_v + \sum_{c' \in N(v) \setminus c} \alpha_{c',v,c}^{j} \cdot R_{c'v}^{j} \tag{9}$$

Equation 10 is one embodiment of a parameterized message passing computation with a parameter βv'c, v. Note that this is a variation of the example in Equation 7. As with the alpha parameter, beta depends on the bit node (v) and check node (c). The beta parameter (for a given bit node and check node) may be different for each iteration. However, the beta parameter (for a given bit node and check node) could be the same for each iteration to simply the learning process and number of saved parameters. Also, it is possible to reduce the number of beta parameters that need to be learned. Hence, it is not required to learn a separate beta parameter for each edge represented in Equation 9.

$$R_{cv}^{j+1} = 2 \cdot \tanh^{-1}\left( \prod_{v' \in N(c) \setminus v} \left( \tanh\left( \frac{Q_{v'c}}{2} \right) \right)^{\beta_{v'c,v}} \right) \tag{10}$$

Equation 11 is one embodiment of a parameterized final decoder estimation with a parameter $\alpha_{c,v}^{j}$. Note that this is a variation of the example in Equation 8.

$$Q_v^j = P_v + \sum_{c' \in N(v)} \alpha_{c',v}^{j} \cdot R_{c'v}^{j} \tag{11}$$

In one embodiment, process 300 learns the parameters in Equations 9, 10, and/or 11. Note that in some cases, multiple parameters might be learned for a single message passing computation. Also note that Equations 9, 10, and/or 11 are just a few of many possible parameterized message passing computations that can be learned in various embodiments.

Figure 6:
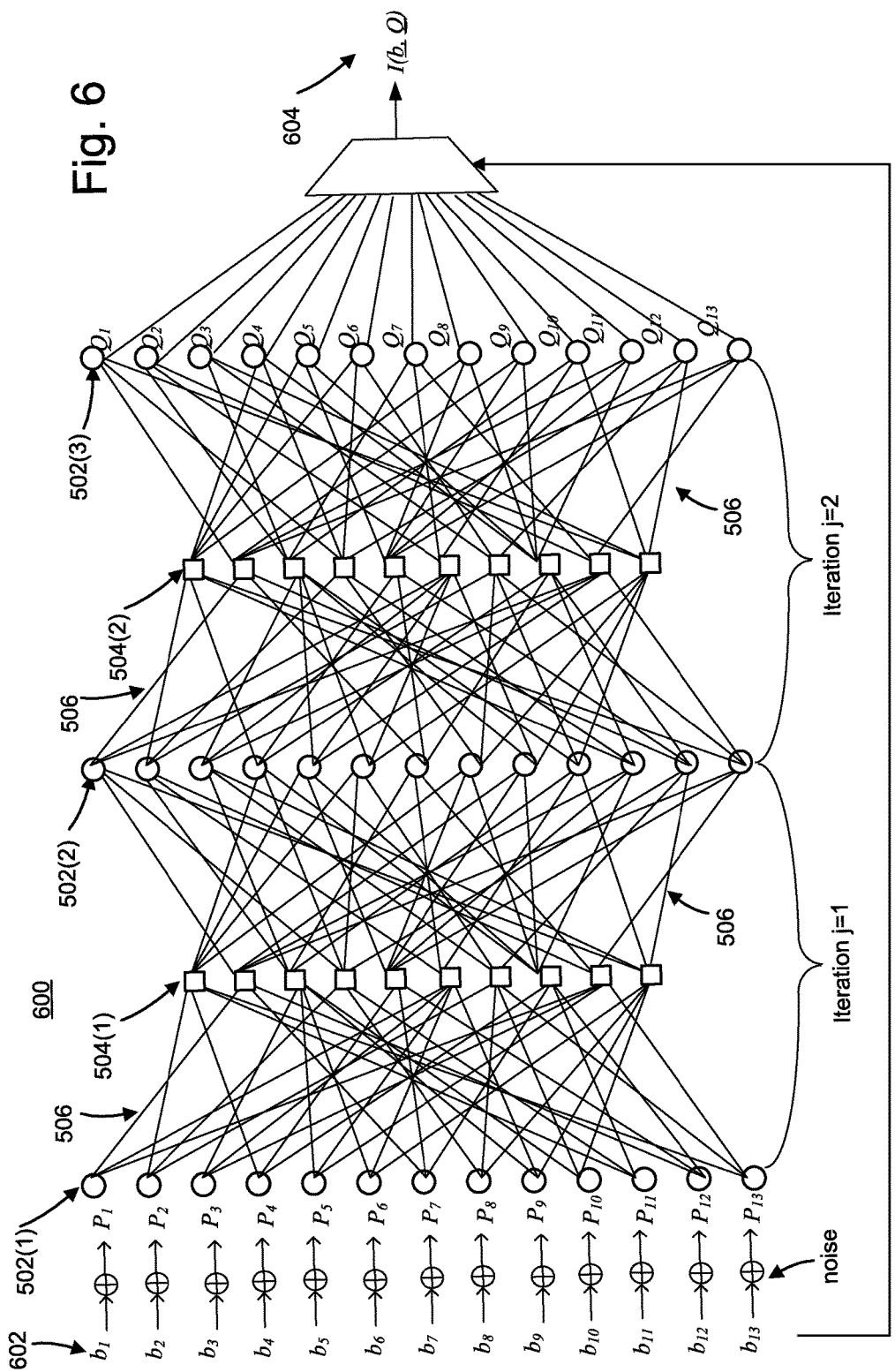
FIG. 6 is an example network that may be used when learning parameters for a parameterized iterative message passing decoder.

FIG. 6 is an example network 600 that may be used when learning parameters for a message passing decoder. The network 600 is an "unfolded" version of the sparse bipartite graph 500 of FIG. 5. The three sets of bits nodes 502(1)-502(3) are actually the same set of bit nodes 502. Likewise, the two sets of check nodes 504(1)-504(2) are actually the same set of check nodes 504. The network 600 shows two iterations (j=1, j=2) of passing messages along the edges 506 between the bit nodes 502 and the check nodes 504. Note that network 600 is not a fully connected network. By "not fully connected network" it is meant that not a node in one level is not connected to all nodes in the next level. Here, the "levels" are the different sets of bit and check nodes.

A codeword (b$_v$) 602 is depicted. Note that this is an example of a clean codeword. The codeword 602 contains a vector of 13 bits (b$_1$-b$_{13}$), in this example. Each bit in the codeword is either a 0 or a 1, in one example. Some other value could be used to represent the two states (e.g., each bit in the codeword may be either a −1 or a +1). The input to the network 600 are a set of a-priori LLRs (P$_1$-P$_{13}$), which are fed into the bit nodes 502(1). An LLR contains both an estimate of the bit and a confidence in that estimation, in one embodiment. An LLR could be a floating point value, a fixed point value, but is not limited to these example.

In one embodiment, the a-priori LLRs are generated by adding noise to the bits of the clean codeword 602. The values of the bits in the codeword may also be normalized. In one embodiment, the a-priori LLRs are generated by reading data that was stored in non-volatile memory. The data that is read from non-volatile memory will typically be noisy due to well-known factors such as read disturb, program disturb, charge loss, etc. The a-priori LLRs may be generated based on reading only hard bits or based on reading both hard and soft bits.

The result at the bit nodes 502(3) after the second iteration is a set of a-posteriori LLRs (Q$_1$-Q$_{13}$), in this example. The a-posteriori LLRs are the final estimates of the bits in the codeword. FIG. 6 shows a "labeled output" 604. In this example, the labeled output 604 is given by:

$$I(\underline{b}, \underline{Q}) = \sum_v 1 - \log_2(1 + 2^{-Q_v \cdot b_v}) \tag{12}$$

Note that the labeled output 604 is a function of the codeword by and the a-posteriori LLRs, in this example. Equation 12 may be referred to as "mutual information" between the clean codeword and the decoder result (e.g., the final estimate of the bits). Note that FIG. 6 depicts the clean codeword 602 being passed to the output 604. In one embodiment, a goal is to attempt to maximize this mutual information in order to learn the parameters. It may be that the mutual information increases as the parameters are revised up to some point at which the mutual information no longer increases. In one embodiment, the learning process is stopped at this point.

Equation 12 is an example of a labeled output that is based on a soft bit estimation. This may help to determine smooth gradients for the network 600. Such gradients may define how much an infinitesimal change in a parameter will change the labeled output. However, the labeled output is not required to be based on a soft bit estimation. In one embodiment, the labeled output is a decoder "hard decision", such as the clean codeword.

FIG. 7 is a flowchart of one embodiment of a process 700 of learning parameters for message passing computations. The process 700 provides further details for one embodiment of steps 302 and 304 of process 300. The process 700 describes processing one batch of codewords. The process 700 may be used with a network such as network 600 of FIG. 6. Thus, process 700 will refer to the network 600 of FIG. 6 for purpose of discussion, but is not limited to that network 600. For the sake of discussion, an example in which the alpha and beta parameters for Equations 9, 10, and 11 will be discussed. At the start of process 700, the values for the parameters could be set arbitrarily. Alternatively, the values for the parameters may have been previously learned from performing a parameter learning process including, but not limited to, process 700.

Step 702 includes passing a noisy codeword forward through the network 600. A forward pass refers to processing from the input nodes 502(1) to the output nodes 502(3) of the network 600. Note that step 702 may be accomplished by simply inputting the noisy codeword into the decoder 244. Step 702 includes performing message passing computations, in one embodiment. Referring to the example network 600 of FIG. 6, a message passing computation may be performed for each edge 506. Although two iterations are depicted in FIG. 6, more or fewer iterations may be performed in step 702. In one embodiment, the number of iterations is kept relatively low to deliberately prevent the a-posteriori LLRs from becoming too high. This may help to train the decoder 244 to operate better when a lower number of iterations are used, which can help the parameterized decoder 244 to converge faster.

Step 702 may include performing bit node to check node computations, as well as check node to bit node computations. In one embodiment, bit node to check node computations as shown in Equation 9 are performed for bit nodes 502(1) to check nodes 504(1); check node to bit node computations as shown in Equation 10 are performed for check nodes 504(1) to bit nodes 502(2); bit node to check node computations as shown in Equation 9 are performed for bit nodes 502(2) to check nodes 504(2); and check node to bit node computations as shown in Equation 10 are performed for check nodes 504(2) to bit nodes 502(3). Note that a separate set of parameters may be learned for each iteration (j). However, another option is to simplify learning by using the same parameters for each iteration.

Step 704 includes computing a labeled output 604 of the decoder 244. With respect to the example network 600 of FIG. 6, labeled output 604 may be computed. One example labeled output is given in Equation 12 above. However, a different equation may be used for the labeled output. As noted above, the number of decoder 244 iterations may be kept deliberately low, which can keep the mutual information in Equation 12 lower. This may allow for better learning of the parameters. By deliberately low in this context, it is meant lower than would typically be used if the decoder 244 were being used to attempt to converge for all codewords.

Step 706 includes a backward pass through the network 600. In step 706, one or more partial derivatives may be computed. These partial derivatives may be computed by stepping backwards through the network 600. The partial derivatives may include, but are not limited to, partial derivatives of the labeled output with respect to the a-posteriori LLRs, a message computation with respect to a parameter, a message computation with respect to another message computation. Example partial derivatives are depicted in FIGS. 8A-8G. Also note that step 706 may include determining gradients for each of the parameters. The gradient for a parameter may indicate how much the labeled output 604 will change with an infinitesimal change in the parameter. Example gradients are depicted in FIGS. 8H-8J. The example partial derivatives and gradients will be discussed in further detail below.

In one embodiment, the decoder 244 has one set of computation units to perform the message computations of the forward pass, and another set of computation units to perform the computations of the backward pass. In one embodiment, some of the decoder circuitry, such as a router that is used for the forward pass might be re-used for the backward pass (perhaps with some slight modifications).

After this codeword has been processed, a determination is made whether to process another codeword. If so, process 700 returns to step 702 to process the next codeword in the batch. Thus, a set of partial derivatives may be determined in step 706 for each of the codewords in the batch. Moreover, a gradient of each parameter may be determined in step 706 for each codeword. After all codewords in the batch have been processed, step 710 is performed.

Step 710 includes revising the parameters based on the parameter gradients. In one embodiment, the parameter gradients computed for each codeword in step 706 are averaged. Averaging the parameter gradients can help to average out the influence of the specific noisy realization, such that only the graph related trends will remain. For example, the averaged gradients may be the gradients that optimize the computation rules for multiple noise realizations, by capturing the graph cycle properties and their induced statistical dependencies, rather than optimizing the computation rules for a specific input (e.g., "over fitting"). The parameters may then be revised based on the averages.

Equations 13-15 are examples for revising parameters used in Equations 9, 10, and 11, respectively.

$$\alpha_{c'_{v,c}}^{j,new} = \alpha_{c'_{v,c}}^{j,old} + \frac{dI}{\alpha_{c'_{v,c}}^{j}} \cdot \delta_\alpha \tag{13}$$

$$\beta_{c'_{v,c}}^{j,new} = \beta_{c'_{v,c}}^{j,old} + \frac{dI}{\beta_{c'_{v,c}}^{j}} \cdot \delta_\beta \tag{14}$$

$$\alpha_{c'_v}^{j,new} = \alpha_{c'_v}^{j,old} + \frac{dI}{\alpha_{c'_v}^{j}} \cdot \delta_\alpha \tag{15}$$

The deltas ($\delta_\alpha$, $\delta_\beta$) are learning rate factors, which may determine the step size. The learning rate factors may determine how fast the parameters are learned. The value for the deltas may be selected to achieve a desired learning rate. The term "learning rate factor" is being used herein as the term is commonly used with respect to neural networks.

Note that various additional optimization "knobs" and "tweaks", such as momentum and weight decay may be used as well. The term "momentum" is being used herein as the term is commonly used with respect to neural networks. Using momentum can help to keep the labeled output on the same trajectory. In other words, this can help to keep the labeled output from a zig-zag pattern. Momentum may also help to avoid having the labeled output getting stuck in a local minima. Thus, momentum can help the learning process to properly converge. Weight decay here refers to the term "weight decay" as the term is commonly used with respect to neural networks. In some embodiments, a suitable value for the weight decay is selected to help prevent over-fitting or under-fitting.

Process 700 may also be applied also to codes that are based on lifted graphs (e.g. quasi-cyclic LDPC codes). In this case, the computation rules used for each "lifted" node or "lifted" edge may be identical (due to symmetry of the graph and the computation tree for all the nodes/edges within a "lifted" node/edge). Hence, the averaging of the gradients may also be performed over all the gradients associated to nodes/edges of a "lifted" node/edge. This reduces the number of parameters that require training and speeds up the training process.

In order to further reduce the number of parameters and the dimensionality of the problem, some additional constraints may be applied to the parameters. For example, in one embodiment, forcing is used. An example Equation that may be used for forcing is shown in Equation 16.

$$\forall c \alpha_{c'v,c}^j = \alpha_{c'v}^j \quad (16)$$

Equation 16 shows a constraint applied to the alpha parameter associated with a bit node to check node message computation. For example, a given bit node may send messages to several check nodes. In one embodiment, the value for the alpha parameter may be different for the messages to the different check nodes. Equation 16 shows how the value of alpha can be forced to be the same for all of the bit node to check node message computations for a given bit node (for a given iteration j). Note that the value of alpha may be different for different iterations (j). The forcing technique can be used for other parameters, such as the betas in the check node to bit node computations.

Additionally, some restraining may be applied to the parameters, such as limiting them to values between 0 and 1. This may stabilize and speed up the training process. A reasoning behind such restraining is that the parameters may be viewed as "damping" factors applied to the message computation rules. These damping factors may, for example, compensate for statistical dependencies of between messages. In case the messages are statistically independent (e.g., if there are no cycles in the computation graph), then there is no need for damping (e.g., $\alpha_{c'v}=1$). As the statistical dependencies become stronger (as in the case of multiple short cycles in the computation graph), then the damping will be stronger (e.g., $\alpha_{c'v} \to 0$), up to complete damping (e.g. $\alpha_{c'v}=0$) in case a message is fully correlated with previous messages.

After completing process 700 on one batch of noisy codewords, process 700 may then be used on the next batch of noisy codewords, this time using the new values for the parameters. Thus, with each batch of noisy codewords, the parameters may be further revised. In one embodiment, this training process continues until a soft metric at the output of the network (e.g., the labeled output 604) will saturate (e.g., reach some maxima around which it will fluctuate).

FIGS. 8A-8J are examples of partial derivatives that may be computed during the backward pass of one embodiment of step 706 in FIG. 7. This is referred to as a backward pass because the order in which the partial derivatives are computed may be from the output 604 to the input of the network.

FIG. 8A is an example equation for the partial derivative of the labeled output (I) with respect to the a-posteriori LLRs (Q). FIG. 8B is an example equation for the partial derivative of the a-posteriori LLRs (Q) with respect to the check node to bit node message computation. FIG. 8C is an example equation for the partial derivative of the a-posteriori LLRs (Q) with respect to the parameter ($\alpha_{c'v}^j$) in the final decoder estimation (e.g., Equation 11).

FIG. 8D is an example equation for the partial derivative of the check node to bit node computation with respect to the bit node to check node computation. FIG. 8E is an example equation for the partial derivative of the check node to bit node computation with respect to the parameter βv'c,v in the check node to bit node computation.

FIG. 8F is an example equation for the partial derivative of the bit node to check node computation with respect to the check node to bit node computation. FIG. 8G is an example equation for the partial derivative of the bit node to check node computation with respect to the parameter ($\alpha_{c'v,c}^j$) in the bit node to check node computation.

FIGS. 8H-8J show equations for example parameter gradients. The parameter gradients indicate how the labeled output 604 will change with respect to infinitesimal changes in the parameters. FIG. 8H is an example equation for the partial derivative of the labeled output 604 with respect to the parameter ($\alpha_{c'v,c}^j$) in the bit node to check node computation (e.g., Equation 9). FIG. 8J is an example equation for the partial derivative of the labeled output 604 with respect to the parameter (βv'c,v) in the check node to bit node computation (e.g., Equation 10). FIG. 8J is an example equation for the partial derivative of the labeled output 604 with respect to the parameter ($\alpha_{c'v}^j$) in the final decoder estimation (e.g., Equation 11).

The parameterized message passing computations of Equations 9-11 are just a few examples. Equation 17 shows another example parameterized message passing computation for a variable to check message rule.

$$Q_{vc}^j = P_v + \sum_{c' \in N(v) \backslash c} \left( \alpha_{c'v,c,1}^j \cdot e^{-\alpha_{c'v,2}|R_{c'v}|} + \alpha_{c'v,c,3}^j \cdot \left(1 - e^{-\alpha_{c'v,4}|R_{c'v}|}\right) \right) \cdot R_{c'v} \quad (17)$$

In this parametric model, the coefficient multiplying each check-to-variable message $R_{c'v}$ is not a fixed "damping" factor. It is a function of the check-to-variable message magnitude $|R_{c'v}|$. This way, stronger or weaker damping may be applied in case the reliability of the message is high or low. In another variant, the check-to-variable message magnitude $|R_{c'v}|$, may be replaced by the magnitude of other the check-to-variable messages entering the variable node. FIGS. 8K-8N depict example derivative expressions for the backward pass for the variable to check message rule of Equation 16.

Equation 18 is another example of a parametric message computation.

$$Q_{vc} = P_v + \sum_{c' \in N(v) \backslash c} \left( \alpha_{c'v,c,1} + \alpha_{c'v,c,2} \cdot e^{-\alpha_{c'v,c,3}|\delta(R_{cv},c')|} \right) \cdot R_{c'v'} \quad (18)$$

In Equation 18:

$$\underline{R}_{cv} = \{R_{c'v}, c' \in N(v) \backslash c\} \quad (19)$$

$$\delta(\underline{R}_{cv}, c') = R_{c'v} - \frac{1}{|N(v) \backslash c|} \sum_{c'' \in N(v) \backslash c} R_{c''v} \quad (20)$$

In Equation 18, a higher damping factor may be applied to a message if it resembles it accompanying messages. Note that this may indicate stronger statistical dependencies between the messages.

One embodiment of the decoder 244 contains circuitry for implementing the network 600. The circuitry is capable of performing both the forward pass and the reverse path. The decoder 244 may comprise processors (or computation units) for performing the computations and memory for storing the messages (or the results of the computations).

Figure 9:
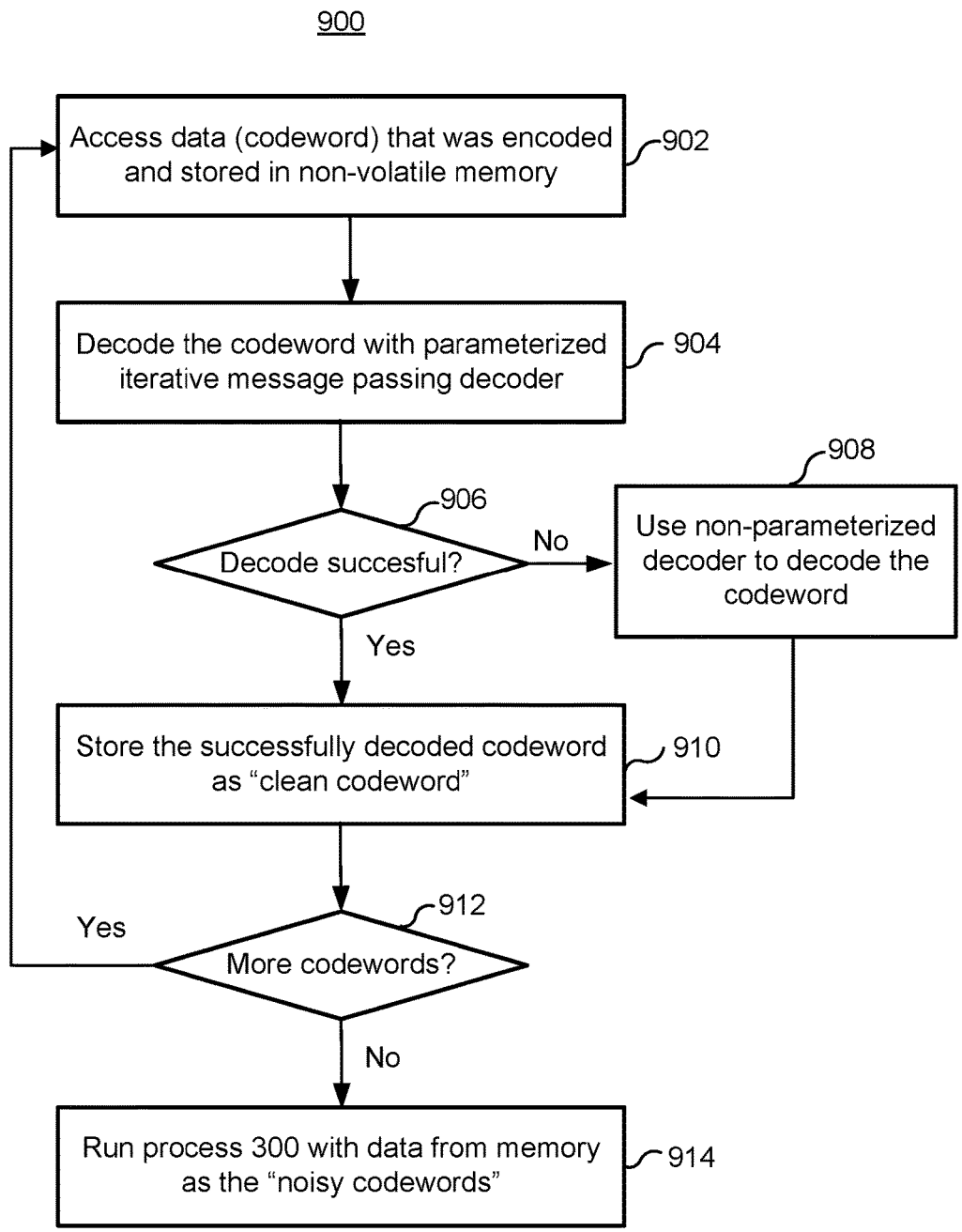
FIG. 9 is a flowchart of one embodiment of a process of online learning of parameters for a parameterized iterative message passing decoder.

FIG. 9 is a flowchart of one embodiment of a process 900 of online learning of parameters for a parameterized iterative message passing decoder 244. The process 900 may be used for cold data, but is not limited to cold data. In some embodiments, learning parameters is based on clean codewords. For example, in the network of FIG. 6, the labeled output 604 is based mutual information between the clean codewords and the a-posteriori LLRs. Process 900 shows one technique for learning clean codewords, which can then be used in the labeled output in order to learn parameters for a parameterized iterative message passing decoder 244.

In one embodiment, process 900 is used when "cold data" as read. Cold data is defined herein as data that is written once or updated very rarely. The following are a few ways to identify cold data. The update frequency of specific data may be tracked. If the update frequency is lower that a threshold frequency, the data is cold data. Another alternative is to identify data according to its application. For example, social media content (such as pictures, videos, statuses, etc.) will be rarely updated. Thus, data associated with certain applications may be assumed to be cold data. Another alternative is to have a predefined classification of data that is known to be rarely updated, such as operational system boot sequence. As another example, a certain memory section or partition may be dedicated for storing cold data or data that is written only once and may be read multiple times.

Cold data may have certain properties that can be learned over time to better tune the parameters to the properties. One example of such properties are "noise realizations." The noise realization may refer to a pattern in an error vector. For example, if a group of memory cells is programmed once and read back many times, then the same memory cells may consistently have the same error. The specific pattern in error vector may be due to faults in the programming process. For example, some memory cells may have been over-programmed or under-programmed. By learning such noise realizations, the decoder 244 can perform better. For example, power can be saved, decoding latency can be reduced, and error correction can be made more accurate.

Note that the error vector is not necessarily constant over time. For example, errors can arise due to read disturb. Thus, the training can also be used to learn about such conditions which change over time. Such training can be used to tailor the decoder 244 to noise statistics (or noise characteristics). Thus, in one embodiment, the decoder is adapted to noise characteristics of the non-volatile memory that change over time. Noise statistics are more general than noise realizations. For example, noise statistics may indicate the percent of bits that are likely to be in error.

Note that process 900 may also adapt the decoder 244 to host traffic characteristics. Thus, learning the parameters can help the decoder to perform better for the specific host traffic characteristics.

Step 902 includes accessing data that was encoded into a codeword and stored in non-volatile memory. This may be cold data, but is not limited to cold data.

Step 904 includes decoding the codeword using a parameterized iterative message passing decoder 224. In step 904, the parameterized iterative message passing decoder 224 may be run for a relatively high number of iterations (if needed) to help the decoder results to converge. In other words, a goal of one embodiment of step 904 is to have a high probability of successfully decoding the noisy codewords. For example, the decoder 224 could be run for up to ten iterations, if needed to converge, as one example. Alternatively, in step 904, the parameterized iterative message passing decoder 224 may be run for a lower number of iterations, wherein the intent is to not to necessarily get the decoder result to converge. For example, the decoder 224 could be run for up to four, five, or six iterations, as one example.

Step 906 is a determination of whether the decoding was successful. If the codeword was successfully decoded, then it is stored as a clean codeword, in step 910. Step 912 is a determination of whether there are more codewords to decode. If so, the process returns to step 902 to read and decode the next codeword.

In the event that a codeword is not successfully decoded (step 906=no), then a non-parameterized decoder 245 may be used to decode the codeword, in step 908. Note that in one embodiment, the non-parameterized decoder 245 may be the parameterized decoder 244 with the parameters set to a default value. For the sake of discussion, it will be assumed that the non-parameterized decoder 245 successfully decodes the codeword. After the successful decode, the clean codeword is stored, in step 910.

When all codewords are processed (step 912=no), the process goes to step 914. In step 914, process 300 is run with the data from the memory as the batch of noisy codewords for step 302. This data may be read using only hard bits or hard bits and soft bits. Either way, a-priori LLRs may be determined for the read in bits. The clean codewords that were stored in step 910 may be used in the labeled output 604. Thus, process 300 may be used in the field to learn one or more parameters for one or more message passing computations. Note that it is during step 914 when the decoder 244 is adapted to factors including, but not limited to, noise realizations of cold data, noise statistics (or characteristics) of the non-volatile memory (which may change over time), and/or host traffic characteristics.

When performing process 300 (in step 914), the number of iterations in the parameterized iterative message passing decoder 224 may be lower than in step 904 (assuming the option of running the parameterized decoder 224 for a higher number of iterations was used in step 904). Note that the goal in training is not necessarily to always successfully decode the codeword. Rather, a goal of the training process is to train the decoder 244 to converge faster. One way in which this may be achieved is to use a relatively low number of iterations. For example, during training the decoder 244 may be run for four, five or six iterations. Also note that the values for the a-posteriori LLRs typically increase with additional iterations of the decoder 244 and may also saturate at some maximal value and, as a result, will not allow compute gradients to be computed (i.e. changing a certain parameter will not change the a-posteriori LLR output as it is already saturated, hence the gradient for the specific parameter cannot be determined). Thus, training using fewer iterations may result in lower a-posteriori LLRs, which can be useful for computing gradients for the different parameters.

Figure 10:
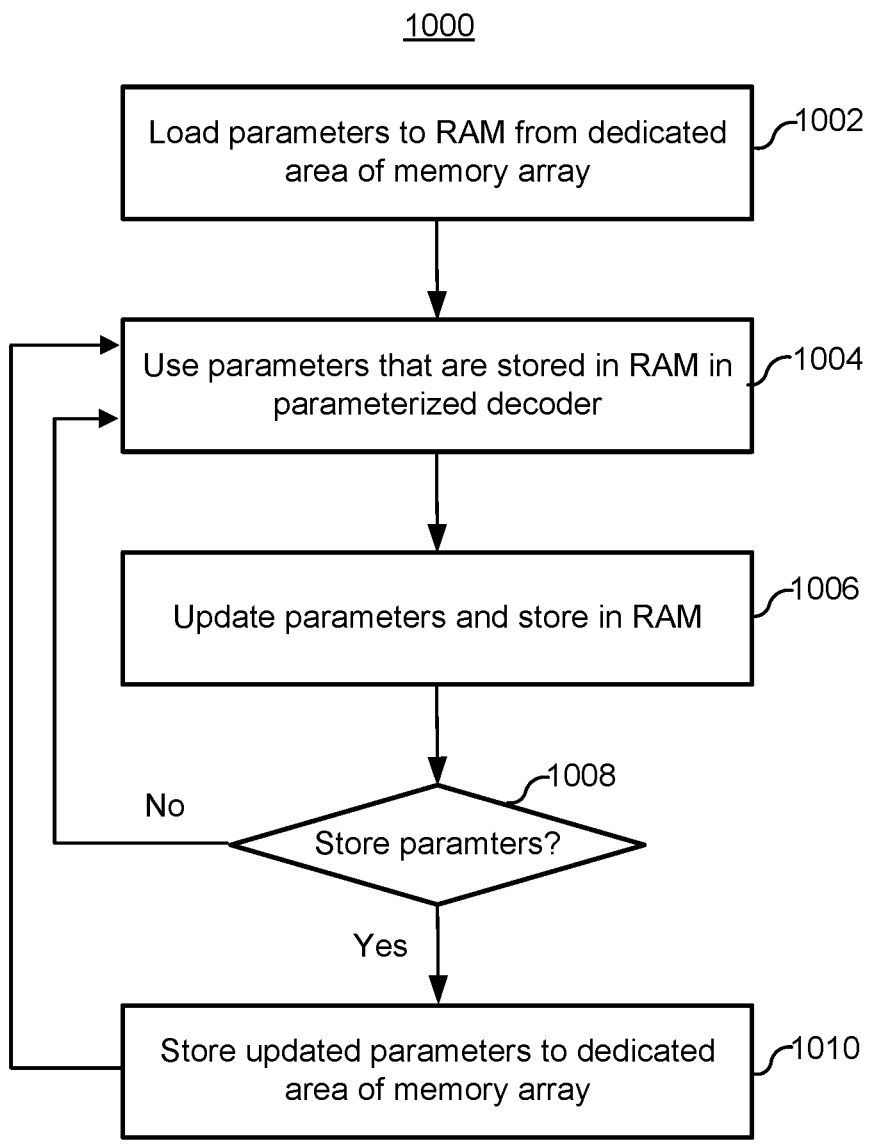
FIG. 10 is a flowchart of one embodiment of a process of managing parameters for a parameterized iterative message passing decoder.

FIG. 10 is a flowchart of one embodiment of a process 1000 of managing parameters for a parameterized iterative message decoder 244. Step 1002 includes loading the parameters to RAM (e.g., 122b, FIG. 1) from a storage device region 126a. Step 1002 might be performed upon initialization of the memory system 100.

Step 1004 includes using the parameters that are stored in RAM in a parameterized iterative message decoder 244.

Step 1006 includes updating the parameters and storing the updated parameters in RAM.

Step 1008 includes determining whether to store the updated parameters in storage device region 126a. The updated parameters may be stored after each "T" updates to the parameters, where "T" may be any integer greater than zero. The updated parameters may also be stored in the event that some warning is given as to a shutdown of the memory system 100.

Step 1010 includes storing the updated parameters to storage device region 126a. The process then returns to step 1004 whether or not the updated parameters are stored to storage device region 126a.

Figure 11:
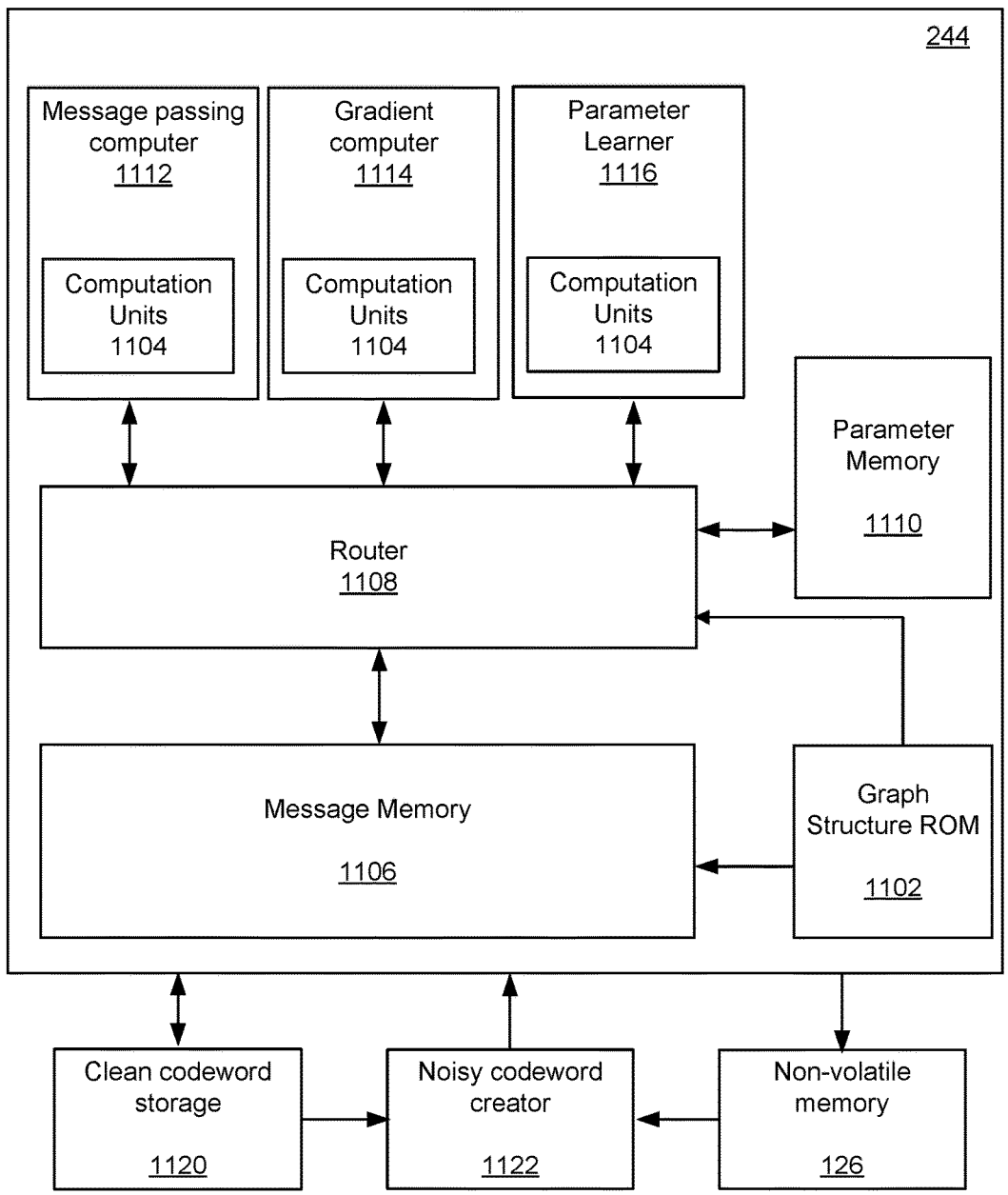
FIG. 11 depicts one embodiment of a memory system having a parameterized iterative message passing decoder.

FIG. 11 depicts one embodiment of a memory system 100 having a parameterized decoder 244. The parameterized decoder 244 has a graph structure ROM 1102, which in one embodiment stores a bipartite graph for the code used by the decoder 244. The parameter memory 1110 stores parameters to be used in computations. In one embodiment, there is a parameter per edge and per iteration of the graph. However, it is not required to have a unique parameter per edge and per iteration of the graph. In one embodiment, the same parameter is used for each iteration. In one embodiment, the same parameter is used for all messages passed from a certain node, at least for one iteration.

The message passing computer 1112 may be configured to compute messages having parameters such as the examples in equations 9-11 and 17. The gradient computer 1114 may be configured to compute partial derivative and gradients, such as FIGS. 8A-8J. The parameter learner 1116 may be configured to compute values for parameters, such as the examples in equations 13-15. The parameter learner 1116 may also be configured to store the learned parameters in parameter memory 1110.

The message passing computer 1112, gradient computer 1114, and parameter learner 1116 each contain computation units 1104 that are configured to perform various computations. Some computation units may be dedicated to perform a certain type of computation. For example, a computation unit 1104 might be hardware that performs one of the equations described herein. Thus, computation units 1104 in message passing computer 1112 may perform message passing computations such as the examples in Equations 9-11 and 17. Computation units 1104 in gradient computer 1114 may perform other computations, such as computing partial derivatives and gradients, such as the examples in FIGS. 8A-8J. Computation units 1104 in parameter leaner may perform equations such as those in Equations 12-15. Note that the computation units 1104 may be configurable based on the parameters. The computation units 1104 are implemented in hardware, in one embodiment, for faster throughput. However, computation units 1104 could be implemented software or as a combination of hardware and software. The message memory 1106 may be used to store results of the computations.

The router 1108 is configured to control a datapath, in one embodiment. The router 1108 may be used to route the messages to the computation units 1104 based on the graph structure. The router 1108 may also be configured to provide the proper parameters to the computation units 1104. Thus, the router 1108 may be used to control what computations are performed between nodes, the order of the computations, etc.

Clean codeword storage 1120 is used to store clean versions of codewords. In one embodiment, the clean versions of codewords are provided in step 910 of process 900. The clean versions could instead be provided offline. The clean codewords are accessed by the decoder 244 to use as labeled output, in one embodiment.

The noisy codeword creator 1122 is configured to create noisy versions of the codewords and to provide the noisy codewords to the decoder 244. In one embodiment, the noisy codeword creator 1122 adds noise to the clean codewords to generate noisy codewords. In one embodiment, noisy codeword creator 1122 reads data from the non-volatile memory 126 and generates initial bit estimations (e.g., LLRs) based thereon. These may be referred to as a-priori LLRs, and may be provided to the decoder 244 as noisy codewords.

The system 100 may also have an encoder (not depicted in FIG. 11), which encodes data and stores the encoded data in the non-volatile memory 126. This data may be encoded in accordance with a code of a bipartite graph of the graph structure in ROM 1102. The decoder 244 decodes this data from the non-volatile memory 126 using the learned parameters, in one embodiment. Note that computation units 1104 in the message passing computer 1112 may be used both when learning the parameters and when decoding data from the non-volatile memory 126. Thus, in the event the computation units 1104 in the message passing computer 1112 are configurable hardware, the system 100 makes efficient use of this configurable hardware.

Note that many messages may need to be read from the memory 1106. However, it might only be possible read one message from the memory 1106 at a time. Hence, memory access could potentially slow the throughput. In some embodiments, lifted graphs are used to help increase throughput. Using lifted graphs can help to both speed up the training process and to store fewer parameters. In some embodiments, there is a symmetry in the lifted graph that results in a set of lifted edges seeing the same cycle structure. In one embodiment, such as set of lifted edges have the same parameter values. Hence, fewer parameters need to be calculated and stored.

One embodiment disclosed herein includes an apparatus, comprising non-volatile memory, a parameterized iterative message passing decoder, and a control circuit. The decoder has a message passing computer configured to perform message passing computations that comprise parameters, a router configured to pass noisy versions of codewords through the decoder, and a parameter learner configured to learn the parameters based on results of passing the noisy versions of the codewords through the decoder and clean versions of the codewords. The control circuit is configured to access encoded data from the non-volatile memory and provide the encoded data to the decoder. The decoder is configured to decode the encoded data using the learned parameters.

One embodiment includes a machine-implemented method comprising the following. A batch of noisy versions of codewords are passed through a parameterized iterative message passing decoder, including performing message passing computations comprising parameters. The parameters are revised based on a-posteriori log likelihood ratios (LLRs) of passing the batch of noisy codewords through the parameterized iterative message passing decoder and clean versions of the codewords. The passing and the revising are repeated with additional batches of noisy versions of codewords until the parameters are learned. Encoded data that was stored in non-volatile memory is accessed. The encoded data is decoded using the learned parameters in the parameterized iterative message passing decoder.

One embodiment includes a non-volatile storage device, comprising non-volatile storage cells; means for performing message passing computations on a batch of noisy versions of codewords over one or more iterations of a sparse bipartite graph to generate a-posteriori log-likelihood ratios (LLRs), wherein ones of the message passing computations have a parameter to be learned, wherein the message passing computations comprise messages between bit nodes and check nodes in the sparse bipartite graph; means for revising the parameters based on mutual information between the a-posteriori LLRs and clean versions of the codewords; means for leaning the parameters based on performing the message passing computations on additional batches of noisy versions of codewords over one or more iterations of the sparse bipartite graph to generate a-posteriori log-likelihood ratios (LLRs) and revising the parameters based on mutual information between the a-posteriori LLRs and clean versions of the codewords with each batch; and means for accessing encoded data from the non-volatile storage cells. The means for performing message passing computations on a batch of noisy versions of codewords is further for decoding the encoded data by performing the message passing computations with the learned parameters over one or more iterations of the sparse bipartite graph.

In one embodiment, the means for performing message passing computations comprises one or more of controller 122, processor 122c, decoder 244, message passing computer 1112, and/or computation units 1104. The means for performing message passing computations may comprise other electronic circuitry.

In one embodiment, the means for revising the parameters comprises one or more of controller 122, processor 122c, decoder 244, gradient computer 1114, parameter learner 1116, and/or computation units 1104. The means for revising the parameters may comprise other electronic circuitry.

In one embodiment, the means for leaning the parameters comprises one or more of controller 122, processor 122c, decoder 244, parameter learner 1116, and/or computation units 1104. The means for leaning the parameters may comprise other electronic circuitry.

In one embodiment, the means for accessing encoded data from the non-volatile storage cells comprises one or more of controller 122, processor 122c, state machine 112, on-chip address decoder 114, power control 116, read/write circuits 128, and/or sense block SB. The means for accessing encoded data from the non-volatile storage cells may comprise other electronic circuitry.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   non-volatile memory;
   a parameterized iterative message passing decoder comprising:
   a message passing computer configured to perform message passing computations that comprise a parameter;
   a router configured to pass noisy versions of codewords through the decoder to determine mutual information between a decoded result for each noisy codeword and clean versions of the codewords;
   a parameter learner configured to learn the parameter based on a rate of change of the mutual information with respect to the parameter; and
   a control circuit configured to access encoded data from the non-volatile memory and provide the encoded data to the decoder, wherein the decoder is configured to decode the encoded data using the learned parameter.

2. The apparatus of claim 1 wherein:
   the decoder further comprises a gradient computer configured to determine the rate of change of the mutual information with respect to the parameter for each noisy codeword.

3. The apparatus of claim 1, wherein the control circuit is configured to pass batches of the noisy versions of the codewords to the decoder, wherein the parameter learner is configured to revise the parameter with each batch.

4. The apparatus of claim 3, wherein the control circuit is configured to pass additional batches of the noisy versions of the codewords to the decoder until the mutual information saturates.

5. The apparatus of claim 1, wherein to the parameter learner is configured to attempt to minimize a bit error rate that results from passing the noisy codewords through the decoder.

6. The apparatus of claim 1, wherein the noisy codewords are log likelihood ratios based on data that was previously stored in the non-volatile memory.

7. The apparatus of claim 6, wherein the parameter learner is further configured to adapt the decoder to noise characteristics of the non-volatile memory that change over time, the parameter learner is configured to adapt the decoder based on results of passing the noisy codewords through the decoder.

8. The apparatus of claim 6, wherein the parameter learner is further configured to adapt the decoder to host traffic characteristics, based on parameters that are learned from results of passing the noisy codewords through the decoder.

9. The apparatus of claim 1, wherein the noisy codewords are based on cold data that was previously stored in the non-volatile memory, wherein the parameter learner is further configured to adapt the decoder to specific noise realizations of the cold data.

10. The apparatus of claim 1, wherein the decoder further comprises storage that describes a sparse bipartite graph having nodes and edges, wherein the parameter learner is configured to learn the parameter for ones of the edges.

11. The apparatus of claim 1, wherein the mutual information is based on a posteriori log likelihood ratios (LLRs) at an output of the decoder and the clean codewords.

12. A machine-implemented method comprising:
    passing a batch of noisy versions of codewords through a parameterized iterative message passing decoder, including performing message passing computations comprising parameters;
    revising the parameters based on mutual information between a-posteriori log likelihood ratios (LLRs) of passing the batch of noisy codewords through the parameterized iterative message passing decoder and clean versions of the codewords, including revising the parameters based on how much the mutual information would change with respect to a change in the parameters for each noisy codeword;
    repeating the passing and the revising with additional batches of noisy versions of codewords until the parameters are learned;
    accessing encoded data that was stored in non-volatile memory; and decoding the encoded data using the revised parameters in the parameterized iterative message passing decoder.

13. The machine-implemented method of claim 12, wherein repeating the passing and the revising with additional batches of noisy version of codewords until the parameters are learned comprises:

attempting to maximize the mutual information between the a-posteriori LLRs and the clean codewords.

14. The machine-implemented method of claim 12, further comprising:

encoding data in accordance with a code used by the iterative message passing decoder;

storing the encoded data in a non-volatile storage memory array; and reading back the encoded data from the non-volatile storage memory array;

wherein the noisy codewords are based on the encoded data read back from the non-volatile storage memory array.

15. The machine-implemented method of claim 12, wherein the message passing computations comprise belief propagation rules.

16. The machine-implemented method of claim 12, wherein;

the parameterized iterative message passing decoder is based on a sparse bipartite graph having cycles; and revising learning the parameters comprises: learning statistical dependencies between the message passing computations.

17. The machine-implemented method of claim 16, wherein the message passing computations comprise messages between bit nodes and check nodes in the sparse bipartite graph.

18. A non-volatile storage device, comprising:
non-volatile storage cells;

means for performing message passing computations on a batch of noisy versions of codewords over one or more iterations of a sparse bipartite graph to generate a-posteriori log-likelihood ratios (LLRs), wherein ones of the message passing computations have one or more parameters, wherein the message passing computations comprise messages between bit nodes and check nodes in the sparse bipartite graph;

means for revising the one or more parameters based on mutual information between the a-posteriori LLRs and clean versions of the codewords, including means for revising the one or more parameters based on a gradient of ones of the parameters with respect to the mutual information;

means for revising the one or more parameters based on performing the message passing computations on additional batches of noisy versions of codewords over one or more iterations of the sparse bipartite graph to generate a-posteriori log-likelihood ratios (LLRs) and revising the one or more parameters based on the mutual information between the a-posteriori LLRs and clean versions of the codewords with each batch; and means for accessing encoded data from the non-volatile storage cells;

wherein the means for performing message passing computations on a batch of noisy versions of codewords is further for decoding the encoded data by performing the message passing computations with the revised one or more parameters over one or more iterations of the sparse bipartite graph.

19. The non-volatile storage device of claim 18, wherein the means for revising the one or more parameters comprises means for performing the message passing computations on additional batches of noisy versions of codewords to attempt to minimize a bit error rate.

* * * * *